United States Patent [19]

Chang

[11] Patent Number: 5,676,865
[45] Date of Patent: Oct. 14, 1997

[54] METHOD OF AND APPARATUS FOR PROVIDING WELDED JOINTS

[75] Inventor: Dale U. Chang, Windermere, Fla.

[73] Assignee: Thomas & Betts Corporation, Memphis, Tenn.

[21] Appl. No.: 519,841

[22] Filed: Aug. 25, 1995

[51] Int. Cl.$^6$ ............................................. B23K 26/00
[52] U.S. Cl. .............................. 219/121.64; 219/121.63
[58] Field of Search .................... 219/121.63, 121.64, 219/118, 127, 121.69; 228/4.1, 4.5

[56] References Cited

U.S. PATENT DOCUMENTS

| | | | |
|---|---|---|---|
| 3,666,913 | 5/1972 | Haefling et al. | 219/118 |
| 5,057,661 | 10/1991 | Banner | 219/121.69 |
| 5,343,014 | 8/1994 | Ogino et al. | 219/121.64 |
| 5,498,850 | 3/1996 | Das | 219/121.64 |

FOREIGN PATENT DOCUMENTS

| | | | |
|---|---|---|---|
| 57-160590 | 10/1982 | Japan . | |
| 63-130290 | 6/1988 | Japan | 219/121.64 |
| 2-108482 | 4/1990 | Japan . | |
| 2270024 | 2/1994 | United Kingdom . | |

*Primary Examiner*—Geoffrey S. Evans
*Attorney, Agent, or Firm*—Michael L. Hoelter; Salvatore J. Abbruzzese

[57] ABSTRACT

A method for forming a welded joint as between first and second electrical conductive members by the use of a radiant energy source, wherein the first member has a higher reflectivity with respect to the radiant energy than the second member, the method comprising the steps of preselecting respective areas of the first and second members for the welded joint, forming an aperture extending fully through a portion of the selected area of the first member, the portion being selected to be of an area less than the selected area of the second member, placing the first member in overlying relation to the second member with the first member portion disposed interiorly of the perimeter of the selected area of the second member and issuing the radiant energy directly onto the first member and concurrently through the first member apertured portion onto the second member. Assemblies for effecting welding operations are provided.

7 Claims, 4 Drawing Sheets

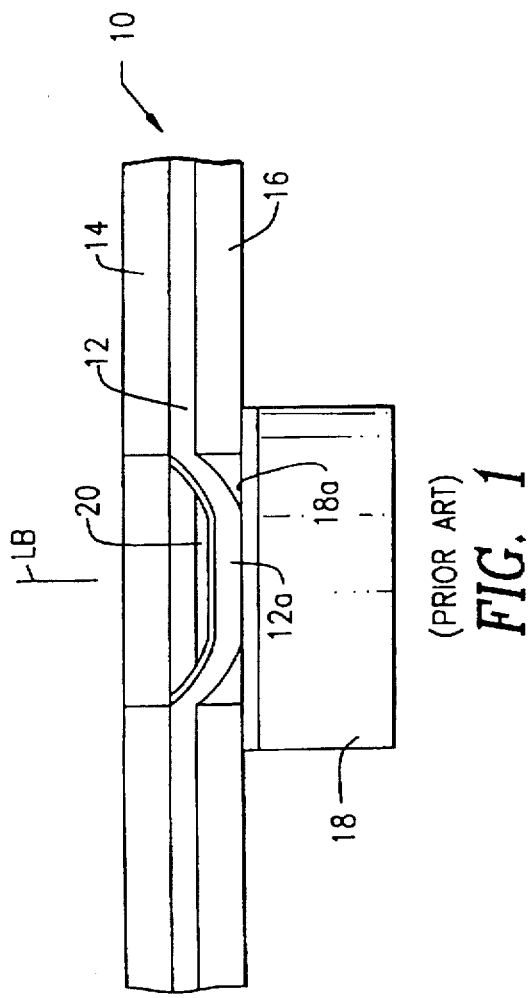
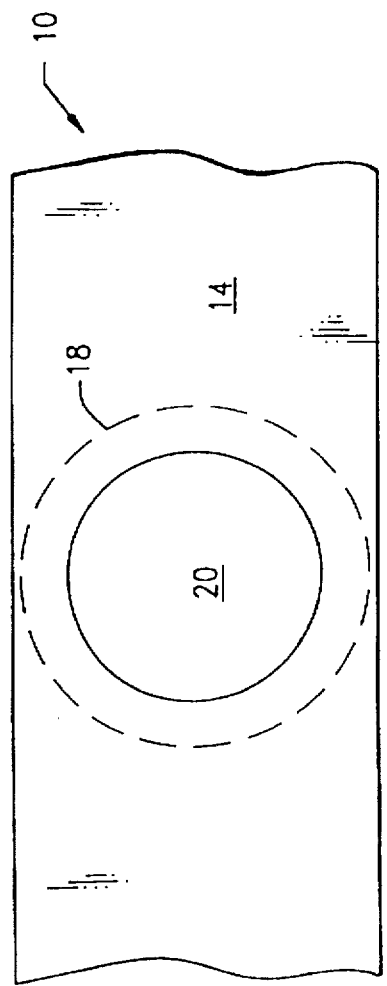
FIG. 1 (PRIOR ART)
FIG. 2 (PRIOR ART)

METHOD OF AND APPARATUS FOR PROVIDING WELDED JOINTS

FIELD OF THE INVENTION

This invention relates in general to welding techniques and pertains more particularly to methods for laser welding of reflective materials to provide welded joints therebetween.

BACKGROUND OF THE INVENTION

By definition, welding of metals to one another requires that each metal be heated to a level where the respective metals achieve a flowable state and flow together to achieved unity therebetween.

The use of laser-derived energy to effect welding has become a common manufacturing practice in a high volume, automated production. However, some materials are difficult to laser weld where one or both of the materials is highly reflective to the particular laser beam used in welding. Copper, silver, gold, aluminum and other materials with a highly polished surface are examples of materials which are difficult to laser weld.

Absorptive coatings are commonly applied to the surface of the highly reflective material or materials to improve the energy coupling. The coating increases the energy absorption to effect the laser welding process effectively. Several investigators have tried different techniques to improve laser energy coupling at the material surfaces. Black paint, chemical etching, roughening of the surface, chemical coating and other techniques have been tried with a varying degree of success.

Painting or chemical coating may be the most effective of such approaches in that the etching or toughening efforts do not give rise to desired uniformity. However, various disadvantages attend the painting and coating approaches to solve the reflectivity problem. Thus, the selection of a proper coating which does not contaminate the weld is a problem. The coating must be inert to the weld. Application of the coating increases manufacturing costs. The consistency of the coating affects the weld quality. The coating process introduces another unwanted variable in laser welding.

A technique to permit a direct laser welding without the aid of absorptive coating will evidently improve product quality and productivity. Substantial cost savings will also be possible if a simple technique is available for direct laser welding of reflective materials, particularly in automated high volume production situations.

Unfortunately, from applicant's viewpoint, such a technique has not been heretofore been available.

SUMMARY OF THE INVENTION

The present invention has as its primary object the provision of a technique for direct laser welding of highly reflective materials without the aid of coating or painting of the material.

In attaining the above and other objects, the invention provides a method for forming a welded joint as between first and second electrically conductive members by the use of a radiant energy source, wherein the first member has a higher reflectivity with respect to the radiant energy than the second member, the method comprising the steps of preselecting respective areas of the first and second members for the welded joint, forming an aperture extending fully through a portion of the selected area of the first member, the portion being selected to be of an area less than the selected area of the second member, placing the first member in overlying relation to the second member with the first member portion disposed interiorly of the perimeter of the selected area of the second member and issuing the radiant energy directly onto the first member and concurrently through the first member apertured portion onto the second member.

In a preferred practice, the radiant energy is selected to be derived from a laser beam and the first member is selected to be copper. The second member is selected to be copper and bears a coating thereon which renders the second member less reflective to radiant energy than the first member, e.g., the coating includes nickel.

The first member is generally planar and the step of forming an aperture extending fully through a portion of the selected area of the first member is desirably practiced so as to provide at least a part of the first member extending downwardly and outwardly of the plane of the first member.

The foregoing and other objects and features of the invention will be further understood from the following detailed description thereof and from the drawings, wherein like components are identified by common reference numerals throughout.

BRIEF DESCRIPTION OF THE DRAWING FIGURES

FIG. 1 is a front elevation of a prior art practice for attaining a welded joint between a pair of electrical conductors.

FIG. 2 is a plan view of the FIG. 1 arrangement.

DETAILED DESCRIPTION OF THE PREFERRED EMBODIMENT(S)

Figure 3:
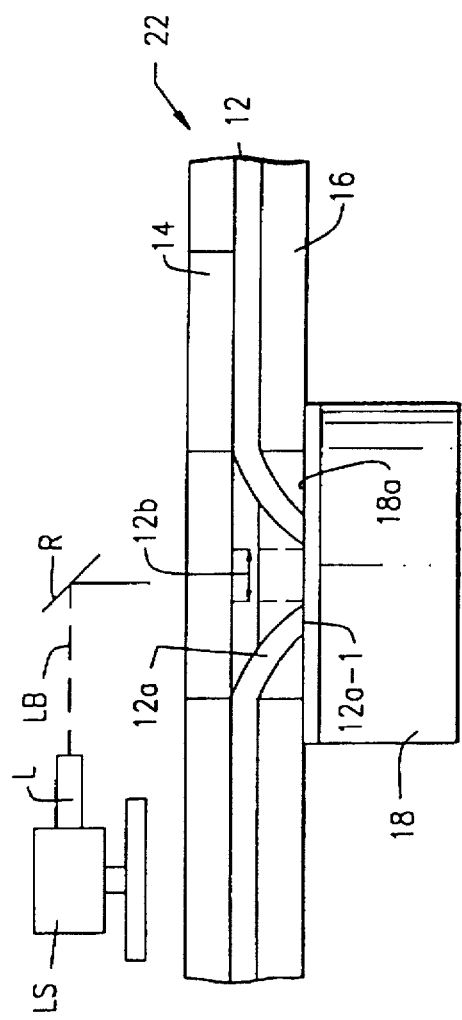
FIG. 3 is a front elevation of a preferred practice for attaining a welded joint between an electrical conductor and a contact in accordance with the invention.

Referring to FIGS. 1 and 2, the above-noted welding practice involving coating of copper to lessen its reflectivity to a laser beam will now be discussed in more detail.

Flexible PCB (printed circuit board) or ribbon (flat) cable 10 comprises a conductive trace or conductor 12 and opposed layers 14 and 16 of electrically insulative material sandwiching the trace 12. The weldment desired is of trace 12 to contact 18 by practice now outlined.

Circular cutouts are made in layers 14 and 16 to expose the weld target, namely a circular bared area 12a of trace 12. Coating 20 is applied to bared trace area 12a. As illustrated, the coated bared trace area is bowed downwardly into contact with contact 18, which is typically comprised of phosphor bronze with flash of nickel coating 18a. Laser Beam LB is directed onto the upper surface of coating 20 to effect the weldment.

Figure 4:
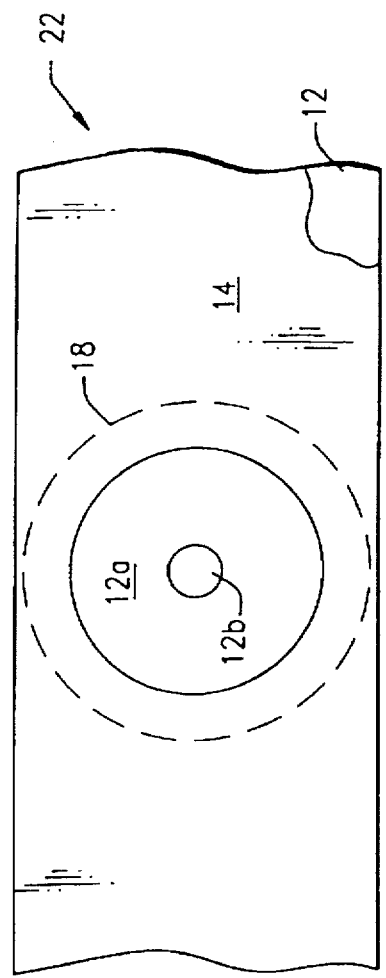
FIG. 4 is a plan view of the FIG. 3 arrangement.

Turning to FIGS. 3 and 4, the preferred practice of the invention is illustrated in the form of the transitional arrangement leading to the weldment. Flexible PCB (printed circuit board) or ribbon (flat) cable 22 comprises conductive trace or conductor 12 and opposed layers 14 and 16 of electrically insulative material sandwiching trace 12. The weldment desired is again, as in FIGS. 1 and 2, of trace 12 to contact 18.

While circular cutouts are again made in layers 14 and 16 to expose circular bared area 12a of trace 12, no coating is applied thereto. Aperture 12b extends fully through bared area 12a, generally centrally thereof and likewise in circular configuration and may be formed by drilling, punching, piercing, etching, etc. As is best seen in FIG. 3, bared area 12 extends downwardly outwardly of the plane of trace 12, terminating in edge or rim 12a-1, which is generally coplanar and in contiguous relation with contact 18. Laser Beam LB is issued directly onto bared area 12a and concurrently through aperture 12b onto contact 18. The beam derives from laser L through reflector R, the laser being supported by support means identified as laser stand LS.

Applicant posits, as a theoretical basis for the effectiveness of the described, coating-less welding practice, that aperture 12b traps the laser beam and initiates a plasma formation to aid subsequent radiant energy absorption. The aperture also allows the laser beam to interact directly with the underlying material, i.e. contact 18, to help laser beam coupling. Once an effective coupling is accomplished, a small plasma ball is created to aid the further absorption of the beam. The plasma ball then melts the reflective material of bared area 12a to effect the welding process.

Figure 5:
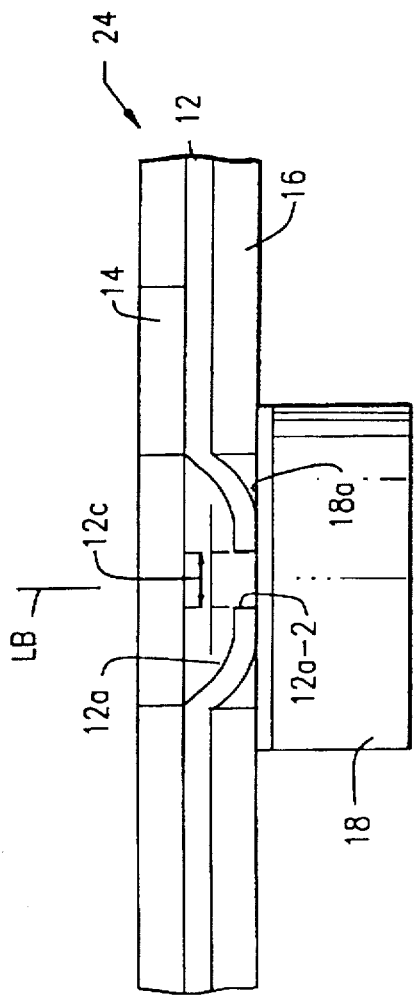
FIG. 5 is a front elevation of another practice for attaining a welded joint between an electrical conductor and a contact in accordance with the invention.
Figure 6:
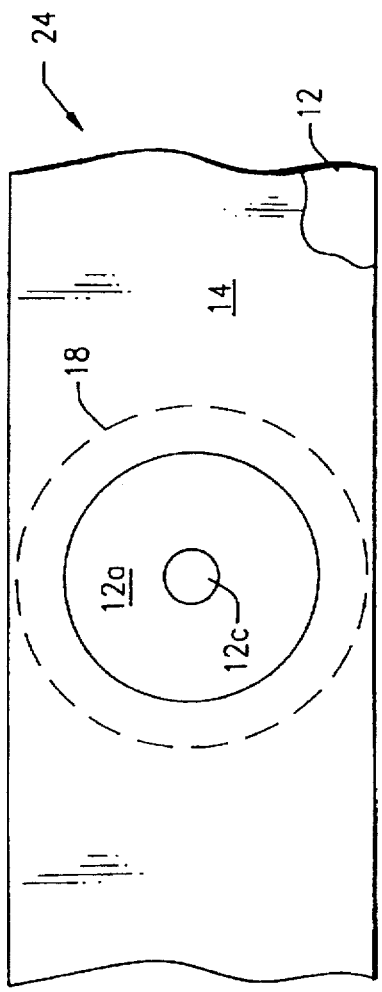
FIG. 6 is a plan view of the FIG. 5 arrangement.

Whereas bared area 12a is deformed convexly into engagement with contact 18 in the embodiment of FIGS. 3 and 4, alternative practice is shown in FIGS. 5 and 6. Flexible PCB (printed circuit board) or ribbon (flat) cable 24 is constituted as in the case of structure 22, but bared area 12a is deformed concavely into engagement with contact 18. The rim of bared area 12a bounding aperture 12c includes flat extent contiguous with contact 18 and the edge 12a-2 of the rim forms an open cylinder generally orthogonal to the plane of structure 24.

Figure 7:
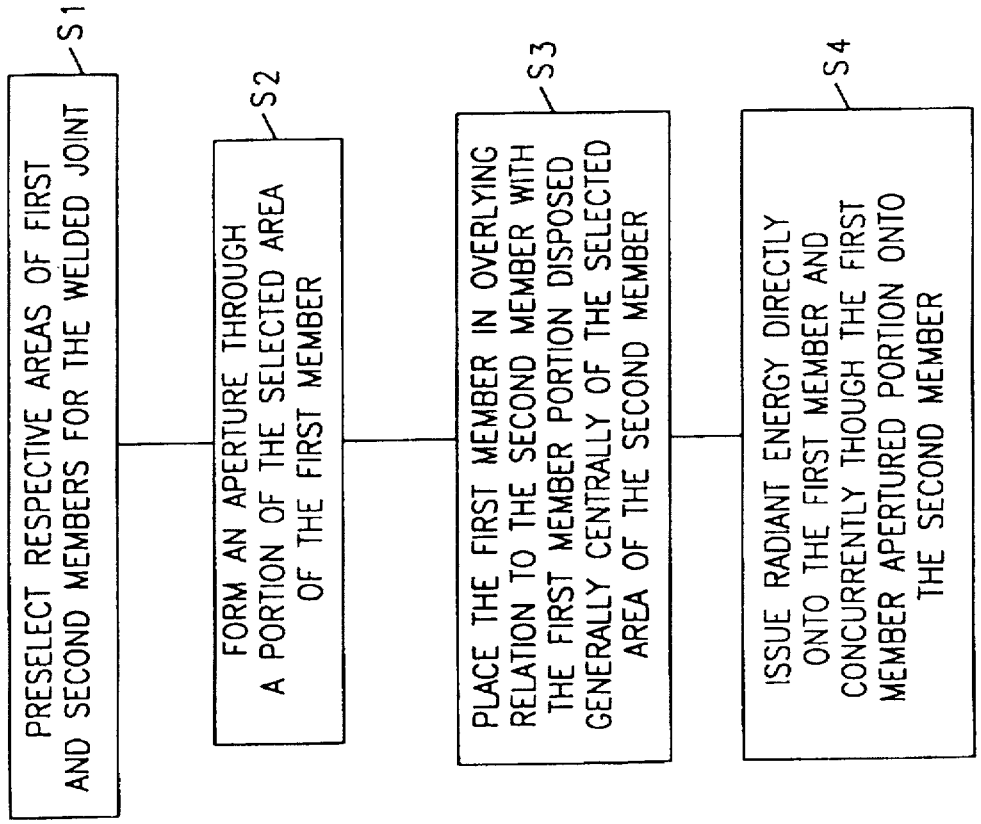
FIG. 7 is a flow chart of the generic method of the invention.

Referring to FIG. 7, the method of the invention, in its generic aspect, will be seen to address the welding of a first member to a second member by radiant energy, wherein the first member has a higher reflectivity to the radiant energy than does the second member.

The method includes step S1, PRESELECT RESPECTIVE AREAS OF FIRST AND SECOND MEMBERS FOR THE WELDED JOINT. This step is realized in FIGS. 3–6 by the selection of bared area 12a and area centrally of contact 18.

Step S2 follows, i.e., FORM AN APERTURE EXTENDING THROUGH A PORTION OF THE SELECTED AREA OF THE FIRST MEMBER. This step is realized in FIGS. 3–6 by the formation of apertures 12b and 12c.

Step S3 follows, i.e., PLACE THE FIRST MEMBER IN OVERLYING RELATION TO THE SECOND MEMBER WITH THE FIRST MEMBER PORTION DISPOSED GENERALLY CENTRALLY OF THE SELECTED AREA OF THE SECOND MEMBER, as is also shown in FIGS. 3–6.

In step S4, ISSUE RADIANT ENERGY DIRECTLY ONTO THE FIRST MEMBER AND CONCURRENTLY THROUGH THE FIRST MEMBER APERTURED PORTION ONTO THE SECOND MEMBER, aperture 12b or 12 traps the radiant energy beam issuing directly (without coating) onto bared area 12a, initiates plasma formation to aid subsequent radiant energy absorption and allows the beam to interact directly with the underlying material, i.e. contact 18, to help beam coupling, creating the small plasma ball to aid the further absorption of the beam and melting of bared area 12a.

As a specific example of materials, dimensions, etc., involved in practicing the invention, structures 22 and 24 may comprise a flexible PCB, which is a 0.004" thick copper trace circuit sandwiched in two 0.003" thick Kapton sheets. The weld target 12a is a circular area of copper trace of a diameter ranging from 0.005" to 0.020". This weld target is fully unplated (uncoated). The contacts are of phosphor bronze with flash of nickel coating having a diameter somewhat larger than the selected target diameter, such that the target is disposed centrally interiorly of the perimeter of the contact.

It is found that the elimination of the nickel plating, and converse welding per the invention with bared unplated or uncoated copper area 12a reduces the porosity of the weldment achieved, increases weld strengths substantially, i.e., at least three-fold, and consistency also improves significantly. In the latter respect, experience with nickel-plated weld targets advises of weak welds with a wide variation of the strengths due to the variation of the nickel plating on the weld target. The reject rate of nickel plated PCB welds ranges from about 2% to about 15% due to inconsistency in nickel plating from batch to batch, but in the case of the bare copper PCB welds, no single failure occurs in thousands of weld joints.

By way of summary and introduction to the ensuing claims, the invention will be seen to provide a method for forming a welded joint as between first and second electrical conductive members by the use of a radiant energy source, wherein the first member has a higher reflectivity with respect to the radiant energy than the second member. The method comprising the steps of preselecting respective areas of the first and second members for the welded joint, forming an aperture extending fully through a portion of the selected area of the first member, placing the first member in overlying relation to the second member with the first member portion disposed interiorly of the perimeter of the selected area of the second member and issuing the radiant energy directly onto the first member and concurrently through the first member apertured portion onto the second member.

The radiant energy preferably derives from a laser beam, the first member may be copper and the second member may bear a coating thereon which renders the second member less reflective to radiant energy than the first member, the coating being such as nickel.

The first member is generally planar and the step of forming an aperture extending fully through a portion of the selected area of the first member is practiced so as to provide at least a part of the first member extending downwardly and outwardly of the plane of the first member.

The step of placing the first member in overlying relation to the second member is practiced so as to place the first member part in contiguous relation with the second member.

The step of forming an aperture extending fully through a portion of the selected area of the first member is desirably practiced so as to provide the part of the first member extending downwardly and outwardly of the plane of the first member to be circular in configuration, preferable so as to place a bounding edge of the first member circular part in contiguous relation with the second member.

The step of issuing the radiant energy directly onto the first member and concurrently through the first member apertured portion onto the second member is practiced so as to form a plasma in and around the first member apertured portion.

The first member may be a copper circuit trace with electrical insulation thereon and the electrical insulation is removed from the copper circuit trace at least in the first area thereof.

Aside from its method aspects, the invention will be appreciated also as providing an assembly for a welding operation to be effected by a given radiant energy source. The assembly comprises a first weldable member comprised of metal and having an uncoated surface thereof exposed for receipt of radiant energy and having an aperture extending through the uncoated surface, a second weldable member having a surface thereof with a lesser reflectivity to energy of the given radiant source than the uncoated surface of the first weldable member, the second weldable member surface being disposed in registry with the aperture of the first weldable member, and means for supporting the given radiant energy source to issue radiant energy thereof onto the first weldable member uncoated surface, into the aperture of the first weldable member and through the aperture of the first weldable member onto the second weldable member surface.

The first and second weldable members may comprise respective electrical conductors and the first weldable member further may comprise a component of a flexible electrical conductor circuit. The second weldable member may comprise a contact to be electrically connected with the first weldable member.

The second weldable member may comprise an electrical contact bearing a coating providing the surface thereof with a lesser reflectivity to energy of the given radiant source than the uncoated surface of the first weldable member. The first weldable member further may comprise electrical insulation covering thereon other than the surface thereof exposed for receipt of radiant energy.

Various changes to the particularly disclosed methods and apparatus may evidently be introduced without departing from the invention. For example, while the apertures 12b and 12c are shown as circular in configuration, any desired configuration may be employed, e.g., square, rectangular, rhombic, etc. Accordingly, it is to be appreciated that the particularly discussed and depicted preferred embodiments and practices of the invention are intended in an illustrative and not in a limiting sense. The true spirit and scope of the invention are set forth in the ensuing claims.

What is claimed is:

1. A method for forming a welded joint as between a substantially planar flexible electrical conductor circuit and a contact, wherein said substantially planar flexible electrical conductor circuit includes a first major surface and a second major surface opposed to said first major surface, said first major surface having disposed thereon a first electrically insulative layer and said second major surface having disposed thereon a second electrically insulative layer, said method comprising:

forming a first aperture in said first electrically insulative layer, said first aperture exposing a first bare area on said first major surface of said conductor circuit, forming a second aperture in said second electrically insulative layer, said second aperture exposing a second bare area on said second major surface of said conductor circuit, said second bare area being formed opposite said conductor circuit from said first bare area, forming a welding aperture communicating between said first bare area and said second bare area, positioning said second insulative layer in contiguous relationship with said contact, said second bare area overlaying said contact, deforming said conductor circuit so as to place a portion of said conductor surface about said aperture in engagement with said contact, and issuing radiant energy onto said first bare area and concurrently through said welding aperture onto said contact so as to heat said contact and said conductor circuit so as to form a mechanical and electrical connection therebetween.

2. A method of claim 1 wherein the step of deforming said conductor circuit deforms said first bare area convexly to be in contiguous relationship with said contact.

3. A method of claim 1 of wherein said flexible electrical conductor circuit is one of a printed circuit board and a ribbon cable.

4. A method of claim 1 wherein said planar flexible electrical conductor circuit is one of a printed circuit board and a ribbon cable.

5. A method of claim 1 wherein said contact has a lesser reflectivity to said radiant energy than said first bare area.

6. An assembly for a welding operation to be effected by a given radiant energy source, comprising:

an electrical contact;

a component of a flexible electrical conductor circuit, said flexible electrical conductor circuit being substantially planar so as to include a first major surface opposed to a second major surface, said first and second major surfaces having a layer of electrically insulative material disposed thereon, each of said layers of electrically insulative material including an aperture therethrough in communication with said flexible electrical conductor so as to expose a first uncoated surface on said first major surface and a second uncoated surface on said second major surface, said first and second uncoated surfaces being on opposing sides of a weldable portion of said flexible electrical conductor circuit, said weldable portion defining a welding aperture therethrough, said weldable portion further having been deformed so as to place said second uncoated surface in contiguous relationship with an electrical contact wherein said welding aperture communicates with said electrical contact; and means for supporting said given radiant energy source to issue radiant energy onto said first uncoated surface, into said welding aperture and through said welding aperture onto said electrical contact.

7. An apparatus of claim 6 wherein said first uncoated surface has a greater reflectivity to energy of said given radiant energy source than said electrical contact.

* * * * *